United States Patent
Choi et al.

(10) Patent No.: US 9,206,350 B2
(45) Date of Patent: Dec. 8, 2015

(54) COMPOSITION COMPRISING QUANTUM DOT, AND DEVICE USING SAME

(71) Applicant: LMS Co., Ltd., Pyeongtaek-si (KR)

(72) Inventors: Myeon Choeon Choi, Anyang-si (KR); Jeong Og Choi, Seoul (KR); Doo Hyo Kwon, Anyang-si (KR)

(73) Assignee: LMS Co., Ltd., Pyeongtaek-si (KR)

( * ) Notice: Subject to any disclaimer, the term of this patent is extended or adjusted under 35 U.S.C. 154(b) by 0 days.

(21) Appl. No.: 14/361,128

(22) PCT Filed: Dec. 1, 2012

(86) PCT No.: PCT/KR2012/010356
§ 371 (c)(1),
(2) Date: Oct. 15, 2014

(87) PCT Pub. No.: WO2013/081432
PCT Pub. Date: Jun. 6, 2013

(65) Prior Publication Data
US 2015/0045499 A1  Feb. 12, 2015

(30) Foreign Application Priority Data

Dec. 1, 2011  (KR) ........................ 10-2011-0127660

(51) Int. Cl.
| | | |
|---|---|---|
| *B82Y 15/00* | (2011.01) | |
| *C09K 11/02* | (2006.01) | |
| *H01L 31/0352* | (2006.01) | |
| *H01L 51/50* | (2006.01) | |
| *C08F 20/10* | (2006.01) | |

(52) U.S. Cl.
CPC ............... *C09K 11/025* (2013.01); *B82Y 15/00* (2013.01); *C08F 20/10* (2013.01); *H01L 31/035218* (2013.01); *H01L 51/502* (2013.01)

(58) Field of Classification Search
CPC .................... H01K 31/035218; H01K 51/502; B82Y 15/00; C09K 11/025; C08F 20/10
See application file for complete search history.

(56) References Cited

U.S. PATENT DOCUMENTS

| | | |
|---|---|---|
| 2006/0157686 A1 | 7/2006 | Jang et al. |
| 2009/0045360 A1 | 2/2009 | Wosnick et al. |
| 2010/0117110 A1* | 5/2010 | Park et al. ........................ 257/98 |
| 2010/0119697 A1* | 5/2010 | Baran, Jr. ........................... 427/8 |
| 2011/0068322 A1* | 3/2011 | Pickett et al. .................... 257/13 |

FOREIGN PATENT DOCUMENTS

| | | |
|---|---|---|
| JP | 200946672 A | 3/2009 |
| KR | 100678285 B1 | 7/2006 |
| KR | 1020100053409 A | 5/2010 |
| KR | 1020120007780 A | 1/2012 |

* cited by examiner

*Primary Examiner* — Peter D Mulcahy
(74) *Attorney, Agent, or Firm* — The Webb Law Firm (57) ABSTRACT

The present invention provides a curable composition comprising an acrylate and a quantum dot, and a device using the same. Since the luminous efficiency and dispersion of a quantum dot are excellent and the curable composition has remarkable UV stability and heat resistance, the curable composition can be effectively applied to various forms of light emitting devices.

17 Claims, 1 Drawing Sheet

COMPOSITION COMPRISING QUANTUM DOT, AND DEVICE USING SAME

CROSS-REFERENCE TO RELATED APPLICATIONS

This application is the United States national phase of International Application No. PCT/KR2012/010356 filed Dec. 1, 2012, and claims priority to Korean Patent Application No. 10-2011-0127660 filed Dec. 1, 2011, the disclosures of which are hereby incorporated in their entirety by reference.

TECHNICAL FIELD

The present invention relates to a composition comprising a quantum dot and a variety of applications using the composition.

BACKGROUND ART

A quantum dot is a material having a nanocrystal structure and consists of several hundred to several thousands of atoms. As the quantum dot has an extremely small size, it leads to quantum confinement. The quantum confinement effect refers to the phenomenon in which the energy band gap of a material increases when the material has a size measured in nanoscale or a smaller measurement scale. As a result, when the light having a wavelength with energy higher than the energy band gap strikes the surface of a quantum dot, the quantum dot absorbs the light, becomes excited, emits a light of a specific wavelength and then returns to the ground state. The wavelength of the emitted light is dependent upon the energy corresponding to the energy band gap.

Generally, the shorter the wavelength of the emitted light, the smaller the particle size of the quantum dot; and the longer the wavelength of the emitted light, the larger the particle size of the quantum dot. This is the electrical/optical characteristic peculiar to the quantum dot, which is different from existing semiconductor materials. It is therefore possible to realize a desired light-emitting characteristic by controlling the size and composition of the quantum dot.

DISCLOSURE OF INVENTION

It is an object of the present invention to provide a curable composition including an acrylate and a quantum dot, and a device using the curable composition.

In accordance with one embodiment of the present invention, there is provided a curable composition including an acrylate and a quantum dot.

The acrylate may have a structure represented by the following Chemical Formula 1. If necessary, the curable composition may further include at least one selected from the group consisting of a single-functional acrylate and a multi-functional acrylate having at least two functional groups.

[Chemical Formula 1]

In chemical formula 1, $X_1$ is hydrogen or a methyl group; and $R_1$ is a $C_6$-$C_{45}$ alkyl group or a $C_7$-$C_{50}$ arylalkyl group.

In accordance with another embodiment of the present invention, there are provided a cured material of the curable composition and a device using the cured material.

The curable composition of the present invention is excellent in regards to the quantum efficiency of the quantum dot, heat resistance and UV stability and thus effectively applicable to a variety of devices.

MODES FOR THE INVENTION

The composition according to the present invention may be a curable composition including an acrylate and a quantum dot. The term "acrylate" includes a monomer, an oligomer, a polymer, and a copolymer, and so forth. The acrylate may enhance the dispersion stability of the quantum dot to increase the quantum efficiency of the quantum dot, promote heat resistance and UV stability and, if necessary, adjust the refractive index.

In one embodiment of the present invention, the acrylate may include an acrylate represented by the following chemical formula 1 as a polymerization unit:

[Chemical Formula 1]

In chemical formula 1, $X_1$ is hydrogen or a methyl group; and $R_1$ is a $C_6$-$C_{45}$ alkyl group or a $C_7$-$C_{50}$ arylalkyl group.

For example, the acrylate having a structure represented by chemical formula 1 includes the structures presented in Table 1.

TABLE 1

| Chemical structure |
|---|
| <br>OA |
| <br>SA |

TABLE 1-continued

Chemical structure

NPA

The content of the acrylate having a structure of the chemical formula 1 may be 5 to 50 parts by weight, 5 to 30 parts by weight, 10 to 50 parts by weight, 5 to 40 parts by weight, or 10 to 30 parts by weight, with respect to 100 parts by weight of the composition. The acrylate having a structure of the chemical formula 1 has an effect of enhancing the quantum efficiency of the quantum dot, heat resistance and UV stability. In the above-defined range of the acrylate content, the curable composition can acquire high quantum efficiency of the quantum dot, high heat resistance and high UV stability.

In another embodiment of the present invention, the acrylate may further include at least one of a single-functional acrylate monomer and a multi-functional acrylate monomer.

The single-functional acrylate may include, for example, at least one structure of the following chemical formulas 2, 3 and 4:

[Chemical Formula 2]

[Chemical Formula 3]

In chemical formulas 2 or 3, $Y_1$ and $Y_2$ are independently oxygen or sulfur; $X_2$ is hydrogen or a methyl group; $X_4$ is hydrogen or a hydroxide group; $X_3$ and $X_5$ are independently hydrogen or a methyl group; and $Z_1$ and $Z_2$ are independently hydrogen, a $C_1$-$C_{20}$ alkyl group or a phenyl group.

[Chemical Formula 4]

In chemical formula 4, $X_6$ and $X_7$ are independently hydrogen or a methyl group; $Z_3$ is a $C_1$-$C_{20}$ alkyl group or a phenyl group; and n is an integer from 1 to 10.

For example, the single-functional acrylate may include the structures presented in Table 2.

TABLE 2

Chemical structure

PEA

OPPEA

The content of the single-functional acrylate may be 5 to 40 parts by weight, 5 to 30 parts by weight, 10 to 40 parts by weight, or 10 to 30 parts by weight, with respect to 100 parts by weight of the composition. In the above-defined range of the content of the single-functional acrylate, it is possible to control the refractive index of the cured material and realize good mechanical properties of the cured material.

The multi-functional acrylate may include, for example, at least one structure of the following chemical formulas 5 to 9:

[Chemical Formula 5]

In chemical formula 5, $Y_3$ is oxygen, sulfur, —$CH_2$—, $X_8$ and $X_9$ are independently hydrogen or a methyl group; and m and n are independently an integer from 1 to 10.

[Chemical Formula 6]

In chemical formula 6, $Y_4$ is oxygen, sulfur, —$CH_2$—, and $X_{10}$ is hydrogen or a methyl group.

[Chemical Formula 7]

In chemical formula 7, $X_{11}$ is independently hydrogen or a methyl group; and n is an integer from 1 to 10.

[Chemical Formula 8]

In chemical formula 8, $X_{12}$ and $X_{13}$ are independently hydrogen or a methyl group; and m and n are independently an integer from 1 to 10.

[Chemical Formula 9]

In chemical formula 9, $X_{14}$ is hydrogen or a methyl group.

For example, the multi-functional acrylate includes the structures presented in Table 3.

TABLE 3

Chemical structure

BPDA

FDA

BNDA

The content of the multi-functional acrylate may be 30 to 90 parts by weight, 30 to 80 parts by weight, 40 to 80 parts by weight, or 40 to 90 parts by weight, with respect to 100 parts by weight of the composition. It is possible to control the refractive index of the cured material after the curing process by regulating the content of the multi-functional acrylate. Within the above-defined range of the content of the multi-functional acrylate, the cured material can acquire a high refractive index and good mechanical properties.

The curable composition according to the present invention may include a quantum dot dispersed in the acrylate. The type of the quantum dot is not specifically limited as long as it can be dispersed in the acrylate.

In one example, the quantum dot may have an emission peak at either one of a wavelength of 520 to 570 nm and a wavelength of 620 to 670 nm. This includes the case in which the quantum dot emits a green and/or red light. For example, the quantum dot absorbs the light from the blue LED chip or the blue light-emitting fluorescent substance to emit a green and/or red light. In another example, the quantum dot may have an emission peak at a wavelength of 570 to 620 nm. In this case, the quantum dot absorbs the light from the blue LED chip or the blue light-emitting fluorescent substance to emit a yellow light.

The content of the quantum dot may be 0.001 to 10 parts by weight, 0.001 to 5 parts by weight, 0.005 to 10 parts by weight, or 0.005 to 5 parts by weight, with respect to 100 parts by weight of the composition. In the above-defined range of the content of the quantum dot, it is possible to realize good color rendering properties.

The curable composition may further include a fluorescent substance. For example, the fluorescent substance may be dispersed together with the quantum dot in the acrylate; or a layer in which the fluorescent substance is dispersed is separately formed. By using the quantum dot and the fluorescent substance together, it is possible to realize high quantum efficiency and good color rendering properties.

The present invention also provides a cured material of the above-described curable composition. The method of forming the cured material is not specifically limited. For example, the curable composition can be cured by applying a light such as UV light or heating.

The cured material can be realized in various forms. For example, the cured material may be in the form of a film or a coating.

The cured material may provide a structure having the quantum dot dispersed in the matrix structure formed from an acrylate polymer. For example, the cured material may be in a form in which the quantum dot is uniformly dispersed in the matrix structure formed from the acrylate polymer.

The cured material may have a refractive index suitable for optical films. For example, the cured material may have a refractive index in the range of 1.3 to 1.8.

The present invention further provides a device including a cured material of the above-described curable composition. The type of the device is not specifically limited. For example, the device may be a lighting device, a backlight device, or a display device.

Hereinafter, the present invention will be described in further detail with reference to the accompanying drawings, which are not intended to limit the scope of the present invention.

Figure 1:
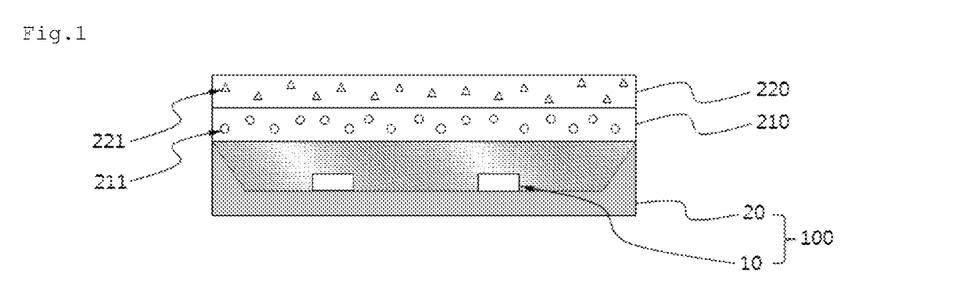
FIGS. 1, 2 and 3 are mimetic diagrams showing an LED device using a cured material of the curable composition according to each embodiment of the present invention.
Figure 2:
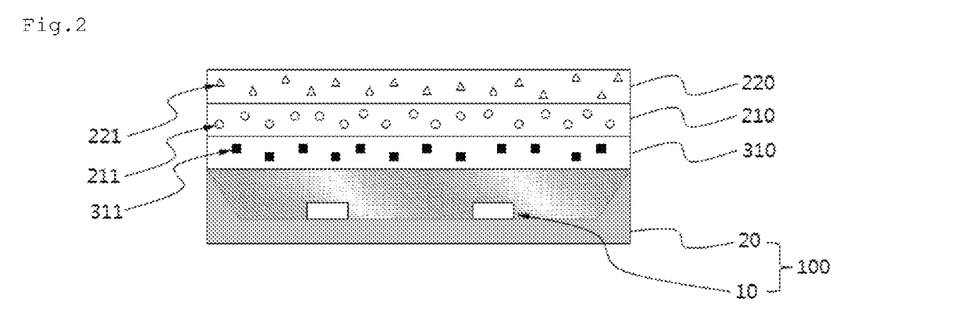
Figure 3:
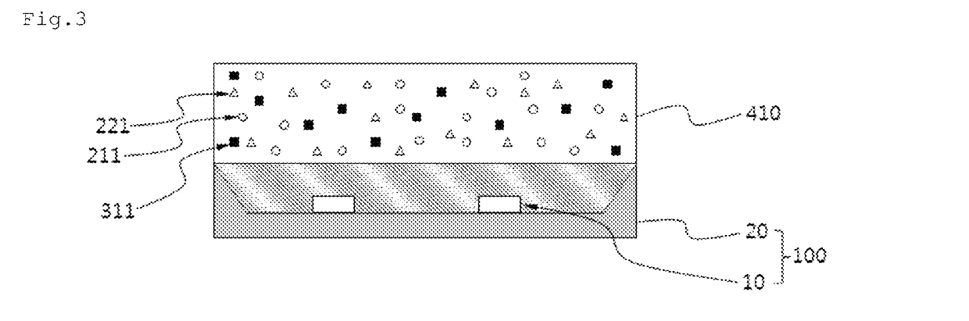

FIGS. 1, 2 and 3 are illustrations of an LED device adapted to the cured material of the curable composition according to each embodiment of the present invention.

The LED device shown in FIG. 1 includes an LED device portion 100 and the first and the second cured material layers 210 and 220 formed on the LED device portion 100 and including a quantum dot. The LED device portion 100 includes a base portion 20 and an LED chip 10 formed in the groove of the base portion 20. The first cured material layer 210 includes a green quantum dot 211 dispersed in the matrix structure formed from an acrylate polymer. The second cured material layer 220 includes a red quantum dot 221 dispersed in the matrix structure formed from the acrylate polymer. The green quantum dot 211 refers to a quantum dot having an emission peak at a wavelength of 520 to 570 nm that is in the green wavelength range. The red quantum dot 221 refers to a quantum dot having an emission peak at a wavelength of 620 to 670 nm that is in the red wavelength range. Also, the LED chip 10 included in the LED device portion 100 may be a blue LED chip having an emission peak at a wavelength of 400 to 450 nm.

The LED device shown in FIG. 2 includes an LED device portion 100, first and second cured material layers 210 and 220 formed on the LED device portion 100 and including a quantum dot, and a third layer 310 including a fluorescent substance. The first cured material layer 210 includes a green quantum dot 211 dispersed in the matrix structure formed from an acrylate polymer. The second cured material layer 220 includes a red quantum dot 221 dispersed in the matrix structure formed from the acrylate polymer. The third layer 310 may include a fluorescent substance 311 that compensates for the light emission of the green quantum dot 211 and/or the red quantum dot 221. The type of the fluorescent substance 311 may be, for example, a fluorescent substance having an emission peak at 520 to 570 nm that is in the green region, and/or 620 to 670 nm that is in the red region.

The LED device shown in FIG. 3 includes an LED device portion and a cured layer 410 formed on the LED device portion 100 and including both a quantum dot and a fluorescent substance. The cured layer 410 has a structure that includes a green quantum dot 211, a red quantum dot 221 and a fluorescent substance 311 that are dispersed in the matrix structure formed from an acrylate polymer.

Hereinafter, the present invention will be described in further detail with reference to the examples, which are given to provide a detailed description of the present invention and not intended to limit the scope of the present invention.

Examples 1 to 6 and Comparative Examples 1 to 3

The ingredients are mixed together with the weight ratio presented in Table 4 to prepare a curable composition. In this regard, the quantum dot is Q632 manufactured by QD Solution company and the photoinitiator is TPO (2,4,6-trimethyl-bezoyl-diphenyl-phosphineoxide) manufactured by BASF company. The mixed composition is applied onto a PET film to form a coating 5 μm thick, which is cured in the nitrogen atmosphere with a metal halide UV curing machine to prepare a film.

TABLE 4

| | Example | | | | | | Comparative Example | | |
|---|---|---|---|---|---|---|---|---|---|
| | 1 | 2 | 3 | 4 | 5 | 6 | 1 | 2 | 3 |
| OA | 30 | | | | | | | | |
| SA | | 30 | | 20 | 10 | 20 | | | |
| NPA | | | 30 | | | | | | |
| MMA | | | | | | | 30 | | |
| BA | | | | | | | | 30 | |
| BPDA | 50 | 50 | 50 | 60 | 70 | | 50 | 50 | |
| FDA | | | | | | 60 | | | 70 |
| PEA | 20 | 20 | 20 | 20 | 20 | | 20 | 20 | |
| OPPEA | | | | | | 20 | | | 30 |
| Photo-initiator | 0.1 | 0.1 | 0.1 | 0.1 | 0.1 | 0.1 | 0.1 | 0.1 | 0.1 |
| Q632 | 0.01 | 0.01 | 0.01 | 0.01 | 0.01 | 0.01 | 0.01 | 0.01 | 0.01 |

In table 4, MMA is methyl methacrylate; BA is butyl acrylate; and the other compounds are as defined in the above table.

Examples 7 to 12 and Comparative Examples 4 to 6

The ingredients are mixed together with the weight ratio presented in Table 5 to prepare a curable composition. In this regard, the quantum dot is Q527 manufactured by QD Solution company and the photoinitiator is TPO (2,4,6-trimethyl-bezoyl-diphenyl-phosphine oxide) manufactured by BASF company. The mixed composition is applied onto a PET film to form a coating 5 μm thick, which is cured in nitrogen atmosphere with a metal halide UV curing machine to prepare a film.

TABLE 5

| | Example | | | | | | Comparative Example | | |
|---|---|---|---|---|---|---|---|---|---|
| | 7 | 8 | 9 | 10 | 11 | 12 | 4 | 5 | 6 |
| OA | 30 | | | | | | | | |
| SA | | 30 | | 20 | 10 | 20 | | | |
| NPA | | | 30 | | | | | | |
| MMA | | | | | | | 30 | | |
| BA | | | | | | | | 30 | |
| BPDA | 50 | 50 | 50 | 60 | 70 | | 50 | 50 | |
| FDA | | | | | | 60 | | | 70 |
| PEA | 20 | 20 | 20 | 20 | 20 | | 20 | 20 | |
| OPPEA | | | | | | 20 | | | 30 |
| Photo-initiator | 0.1 | 0.1 | 0.1 | 0.1 | 0.1 | 0.1 | 0.1 | 0.1 | 0.1 |
| Q527 | 0.01 | 0.01 | 0.01 | 0.01 | 0.01 | 0.01 | 0.01 | 0.01 | 0.01 |

Experimental Example 1

Measurement of Quantum Efficiency and Transmission Rate

The films prepared in Examples 1 to 12 and Comparative Examples 1 to 3 are measured in regards to quantum efficiency and optical transmission. Quantum efficiency is measured with an absolute quantum yield measurement system manufactured by HAMAMATSU PHOTON company, and optical transmission is measured with an absorption spectrophotometer. The measurement results for Examples 1 to 6 and Comparative Examples 1 to 3 are presented in Table 6, and the measurement results for Examples 7 to 12 and Comparative Examples 4 to 6 are presented in Table 7.

TABLE 6

|  | Quantum efficiency (%) | Transmission (%) |
| --- | --- | --- |
| Example 1 | 42.0 | 93 |
| Example 2 | 52.0 | 92 |
| Example 3 | 48.0 | 92 |
| Example 4 | 47.0 | 93 |
| Example 5 | 42.0 | 91 |
| Example 6 | 49.0 | 92 |
| Comparative Example 1 | 25.0 | 88 |
| Comparative Example 2 | 33.0 | 85 |
| Comparative Example 3 | 27.0 | 87 |

Referring to Table 6, the films of Examples 1 to 6 have a quantum efficiency of 42% or greater, while the films of Comparative Examples 1 to 3 have a quantum efficiency of 33% or less. This demonstrates that the films of the present invention are excellent in regards to quantum efficiency and thus applicable to optical devices that are required to have high brightness.

In addition, the films of Examples 1 to 6 have an optical transmission of 91% or greater, while the films of Comparative Examples 1 to 3 have an optical transmission of 88% or less. It is therefore concluded that the films of the present invention are remarkably excellent in regards to optical transmission and thus applicable to optical devices that are required to have transparency.

TABLE 7

|  | Quantum efficiency (%) | Transmission (%) |
| --- | --- | --- |
| Example 7 | 40.0 | 91 |
| Example 8 | 48.0 | 91 |
| Example 9 | 45.0 | 91 |
| Example 10 | 43.0 | 92 |
| Example 11 | 39.0 | 91 |
| Example 12 | 46.0 | 91 |
| Comparative Example 4 | 22.0 | 87 |
| Comparative Example 5 | 29.0 | 85 |
| Comparative Example 6 | 24.0 | 86 |

Referring to Table 7, the films of Examples 7 to 12 have a quantum efficiency of 39% or greater, while the films of Comparative Examples 4 to 6 have a quantum efficiency of 29% or less. This demonstrates that the films of the present invention are excellent in regards to quantum efficiency and thus applicable to optical devices that are required to have high brightness.

In addition, the films of Examples 7 to 12 have an optical transmission of 91% or greater, while the films of the Comparative Examples 4 to 6 have an optical transmission of 87% or less. This shows that the films of the present invention are remarkably excellent in regards to optical transmission and thus applicable to the optical devices that are required to have transparency.

In conclusion, the curable composition according to one embodiment of the present invention can realize high quantum efficiency and high transmission in regards to both the quantum dot emitting a red light (Table 6, Q632) and the quantum dot emitting a green light (Table 7, Q527).

Experimental Example 2

Measurement of UV Stability and Heat Resistance

The films prepared according to Examples 1 to 12 and Comparative Examples 1 to 6 are measured in regards to UV stability and heat resistance. More specifically, in order to evaluate UV stability, the quantum efficiency of each film is first measured and, 48 hours after exposure to UV radiation (365 nm), measured again to calculate the difference in the quantum efficiency ($\Delta QY$, %). For the evaluation of heat resistance, the quantum efficiency of each film is first measured and, after exposure at 90° C. for 240 hours, measured again to calculate the difference in the quantum efficiency ($\Delta QY$, %).

The measurement results for Examples 1 to 6 and Comparative Examples 1 to 3 are presented in Table 8, and the measurement results for Examples 7 to 12 and Comparative Examples 4 to 6 are presented in Table 9.

TABLE 8

|  | UV stability ($\Delta QY$, %) (exposure to UV, 48 hrs) | Heat resistance ($\Delta QY$, %) (90° C., 240 hrs) | Refractive index Liquid | Refractive index Solid |
| --- | --- | --- | --- | --- |
| Example 1 | 5.0 | 3.0 | 1.511 | 1.529 |
| Example 2 | 4.0 | 2.8 | 1.510 | 1.527 |
| Example 3 | 4.0 | 3.2 | 1.525 | 1.545 |
| Example 4 | 7.0 | 3.3 | 1.521 | 1.539 |
| Example 5 | 10.0 | 3.1 | 1.536 | 1.555 |
| Example 6 | 5.0 | 3.4 | 1.573 | 1.594 |
| Comparative Example 1 | 15.0 | 7.0 | 1.509 | 1.528 |
| Comparative Example 2 | 12.0 | 9.0 | 1.510 | 1.530 |
| Comparative Example 3 | 15.0 | 8.0 | 1.603 | 1.622 |

Referring to Table 8, in the aspect of UV stability, the films of Examples 1 to 6 have a $\Delta QY$ value of 10% or less, while the films of Comparative Examples 1 to 3 have a $\Delta QY$ value of 12% or greater. This demonstrates that the films of the present invention are relatively excellent in regards to UV stability and thus preferably applicable to optical devices that need to be exposed to external light (sunlight) for a long time.

In the aspect of heat resistance, the films of Examples 1 to 6 have a $\Delta QY$ value of 3.4% or less, while the films of Comparative Examples 1 to 3 have a $\Delta QY$ value of 7.0% or greater. It is therefore concluded that the films of the present invention are remarkably excellent in regards to heat resistance and thus can maintain their stability against heat generated from LEDs when used with white LED devices.

TABLE 9

|  | UV stability ($\Delta QY$, %) (exposure to UV, 48 hrs) | Heat resistance ($\Delta QY$, %) (90° C., 240 hrs) | Refractive index Liquid | Refractive index Solid |
| --- | --- | --- | --- | --- |
| Example 7 | 5.0 | 4.0 | 1.508 | 1.526 |
| Example 8 | 5.0 | 4.8 | 1.505 | 1.524 |
| Example 9 | 5.0 | 3.7 | 1.523 | 1.545 |
| Example 10 | 6.0 | 3.8 | 1.522 | 1.538 |
| Example 11 | 9.0 | 3.6 | 1.534 | 1.555 |
| Example 12 | 4.0 | 3.7 | 1.576 | 1.597 |
| Comparative Example 4 | 16.0 | 7.4 | 1.506 | 1.526 |
| Comparative Example 5 | 13.0 | 9.5 | 1.511 | 1.531 |
| Comparative Example 6 | 15.0 | 9.0 | 1.601 | 1.620 |

Referring to Table 9, in the aspect of UV stability, the films of Examples 7 to 12 have a $\Delta QY$ value of 9% or less, while the films of Comparative Examples 4 to 6 have a $\Delta QY$ value of 13% or greater. This demonstrates that the films of the present invention are relatively excellent in regards to UV stability and thus preferably applicable to optical devices that need to be exposed to external light (sunlight) for a long time.

In the aspect of heat resistance, the films of Examples 7 to 12 have a ΔQY value of 4.8% or less, while the films of Comparative Examples 4 to 6 have a ΔQY value of 7.4% or greater. It is therefore concluded that the films of the present invention are remarkably excellent in regards to heat resistance and thus can maintain their stability against heat generated from LEDs when used with white LED devices.

As demonstrated above, the curable composition according to one embodiment of the present invention can realize high UV stability and high heat resistance in regards to both the quantum dot emitting a red light (Table 8, Q632) and the quantum dot emitting a green light (Table 9, Q527).

What is claimed is:

1. A curable composition comprising an acrylate and a quantum dot, wherein the acrylate has a structure represented by the following Chemical Formula 1:

[Chemical Formula 1]

wherein $X_1$ is hydrogen or a methyl group; and $R_1$ is a $C_6$-$C_{45}$ alkyl group or a $C_7$-$C_{50}$ arylalkyl group, wherein at least when $X_1$ is a methyl group and $R_1$ is a $C_6$-$C_{45}$ alkyl group, the curable composition further comprises at least one additional acrylate selected from the group consisting of a single-functional acrylate having a single functional group and a multi-functional acrylate having at least two functional groups, wherein the single-functional acrylate comprises at least one structure represented by the following Chemical Formulas 2, 3 and 4:

[Chemical Formula 2]

[Chemical Formula 3]

wherein $Y_1$ and $Y_2$ are independently oxygen or sulfur; $X_2$ is hydrogen or a methyl group; $X_4$ is hydrogen or a hydroxide group; $X_3$ and $X_5$ are independently hydrogen or a methyl group; and $Z_1$ and $Z_2$ are independently hydrogen, a $C_1$-$C_{20}$ alkyl group or a phenyl group,

[Chemical Formula 4]

wherein $X_6$ and $X_7$ are independently hydrogen or a methyl group; $Z_3$ is a $C_1$-$C_{20}$ alkyl group or a phenyl group; and n is an integer from 1 to 10, and wherein the multi-functional acrylate comprises at least one of the structures represented by the following Chemical Formulas 5 to 9:

[Chemical Formula 5]

wherein $Y_3$ is oxygen, sulfur, —$CH_2$—, $X_8$ and $X_9$ are independently hydrogen or a methyl group; and m and n are independently an integer from 1 to 10,

[Chemical Formula 6]

wherein $Y_4$ is oxygen, sulfur, —$CH_2$—, and $X_{10}$ is hydrogen or a methyl group,

[Chemical Formula 7]

wherein $X_{11}$ is independently hydrogen or a methyl group; and n is an integer from 1 to 10,

[Chemical Formula 8]

wherein $X_{12}$ and $X_{13}$ are independently hydrogen or a methyl group; and m and n are independently an integer from 1 to 10,

[Chemical Formula 9]

wherein $X_{14}$ is hydrogen or a methyl group.

2. The curable composition as claimed in claim 1, wherein the curable composition further comprises the at least one additional acrylate selected from the group consisting of a single-functional acrylate having a single functional group and a multi-functional acrylate having at least two functional groups.

3. The curable composition as claimed in claim 2, wherein the at least one additional acrylate comprises a single-functional acrylate comprising at least one structure represented by the following Chemical Formulas 2, 3 and 4:

[Chemical Formula 2]

[Chemical Formula 3]

wherein $Y_1$ and $Y_2$ are independently oxygen or sulfur; $X_2$ is hydrogen or a methyl group; $X_4$ is hydrogen or a hydroxide group; $X_3$ and $X_5$ are independently hydrogen or a methyl group; and $Z_1$ and $Z_2$ are independently hydrogen, a $C_1$-$C_{20}$ alkyl group or a phenyl group,

[Chemical Formula 4]

wherein $X_6$ and $X_7$ are independently hydrogen or a methyl group; $Z_3$ is a $C_1$-$C_{20}$ alkyl group or a phenyl group; and n is an integer from 1 to 10.

4. The curable composition as claimed in claim 2, wherein the at least one additional acrylate comprises a multi-functional acrylate comprising at least one of the structures represented by the following Chemical Formulas 5 to 9:

[Chemical Formula 5]

wherein $Y_3$ is oxygen, sulfur, —$CH_2$—, $$\begin{array}{c} CH_3 \\ | \\ -C- \\ | \\ H \end{array} \quad \text{or} \quad \begin{array}{c} CH_3 \\ | \\ -C- \\ | \\ CH_3 \end{array};$$

$X_8$ and $X_9$ are independently hydrogen or a methyl group; and m and n are independently an integer from 1 to 10,

[Chemical Formula 6]

wherein $Y_4$ is oxygen, sulfur, —$CH_2$—, and $X_{10}$ is hydrogen or a methyl group,

[Chemical Formula 7]

wherein $X_{11}$ is independently hydrogen or a methyl group; and n is an integer from 1 to 10,

[Chemical Formula 8]

wherein $X_{12}$ and $X_{13}$ are independently hydrogen or a methyl group; and m and n are independently an integer from 1 to 10,

[Chemical Formula 9]

wherein $X_{14}$ is hydrogen or a methyl group.

5. The curable composition as claimed in claim 1, wherein the content of the acrylate having a structure of the Chemical Formula 1 is 5 to 50 parts by weight with respect to 100 parts by weight of the composition.

6. The curable composition as claimed in claim 2, wherein the content of the single-functional acrylate is 5 to 40 parts by weight with respect to 100 parts by weight of the composition.

7. The curable composition as claimed in claim 2, wherein the content of the multi-functional acrylate is 30 to 90 parts by weight with respect to 100 parts by weight of the composition.

8. The curable composition as claimed in claim 1, wherein the quantum dot has an emission peak at either one of a wavelength of 520 to 570 nm and a wavelength of 620 to 670 nm.

9. The curable composition as claimed in claim 1, wherein the quantum dot has an emission peak at a wavelength of 570 to 620 nm.

10. The curable composition as claimed in claim 1, wherein the content of the quantum dot is 0.001 to 10 parts by weight with respect to 100 parts by weight of the composition.

11. The curable composition as claimed in claim 1, further comprising a fluorescent substance.

12. A cured material of the composition as claimed in claim 1.

13. The cured material as claimed in claim 12, wherein the cured material is in the form of a film or a coating.

14. The cured material as claimed in claim 12, wherein the cured material has a quantum dot dispersed in a matrix structure formed from a polymer of acrylate.

15. The cured material as claimed in claim 12, wherein the cured material has a refractive index of 1.3 to 1.8.

16. A device comprising the cured material as claimed in claim 12.

17. The device as claimed in claim 16, wherein the device is a lighting device, a backlight device, or a display device.

* * * * *